United States Patent [19]

Van Arsdale et al.

[11] 4,025,147

[45] May 24, 1977

[54] CONNECTOR

[75] Inventors: Larry A. Van Arsdale, Springfield; Dominic J. Russo, Sr., Yankton, both of S. Dak.

[73] Assignee: Dale Electronics, Inc., Columbus, Nebr.

[22] Filed: Jan. 19, 1976

[21] Appl. No.: 650,520

[52] U.S. Cl. .................... 339/176 MP; 339/17 LC

[51] Int. Cl.[2] .................... H05K 1/07; H05K 1/08

[58] Field of Search ............ 339/176 LC, 176 LM, 339/75 MP, 176 MP

[56] References Cited

UNITED STATES PATENTS

| | | | |
|---|---|---|---|
| 3,289,147 | 11/1966 | Takeuchi et al. | 339/176 MP |
| 3,553,630 | 1/1971 | Scheingold et al. | 339/176 MP |
| 3,594,699 | 7/1971 | Jayne et al. | 339/75 MP |
| 3,601,770 | 8/1971 | Bauley | 339/176 MP |

*Primary Examiner*—Roy Lake
*Assistant Examiner*—E. F. Desmond
*Attorney, Agent, or Firm*—Zarley, McKee, Thomte, Voorhees & Sease

[57] ABSTRACT

A connector for an edge board or the like comprising an elongated body defining a card slot with opposed contact slots having an elongated backer frame secured thereto. The lower ends of the body and the backer frame each have a plurality of V-shaped slots formed therein which extend upwardly therein and which are aligned with alternate contact slots. The V-shaped slots of the body define V-shaped projections therebetween. The V-shaped slots of the backer frame also define V-shaped projections therebetween which are adapted to be received in the V-shaped slots of the body with the V-shaped projections of the body being received by the V-shaped slots of the backer frame. Contacts are mounted in predetermined contact slots for electrical contact with the card positioned therein. The lower ends of the contacts extend downwardly through the V-shaped slots and extend downwardly from the body and backer frame. During the assembly of the connector, the body and the backer frame may be cut to provide the proper length connector.

13 Claims, 10 Drawing Figures

CONNECTOR

BACKGROUND OF THE INVENTION

Many sizes and styles of Digital Readout Display Devices are use in calculators, etc. Common types of Digital Readout Display Devices are liquid crystal and gas discharge tube displays. The liquid crystal displays as well as the gas discharge tube displays are available in an extremely wide range of lengths, thicknesses, and contact densities. It is therefore virtually impossible to select any one or group of devices by which to establish a market base for standard product line tooling justification. Thus, as specific potential applications are established, the only alternative to a manufacturer is to "custom design." With tooling charges being extremely high, the tooling charges become a prohibiting factor in the use of such displays in either prototype or ultimate production systems.

Therefore, it is a principle object of the invention to provide a connector which is adaptable to various physical and mechanical problems normally encountered in Digital Readout Display Devices.

A further object of the invention is to provide a connector which may be easily fabricated in various lengths.

A still further object of the invention is to provide a connector which is capable of accommodating different card widths.

A still further object of the invention is to provide a connector which permits a variety of contact density and spacing.

A further object of the invention is to provide a connector including index registration features.

A still further object of the invention is to provide a connector including means for mounting the same.

A still further object of the invention is to provide a connector which is economical to manufacture, durable in use and refined in appearance.

DESCRIPTION OF THE PREFERRED EMBODIMENT

Figure 1:
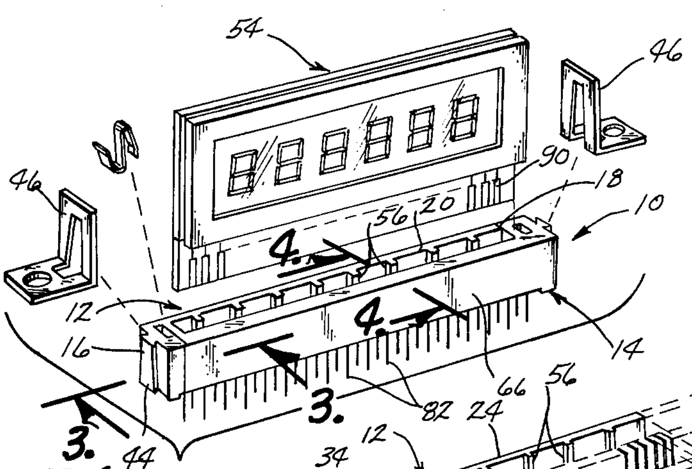
FIG. 1 is an exploded perspective view of the connector together with a typical display device and means for mounting the same.

The connector of this invention is referred to generally by the reference numeral 10 in FIGS. 1–7. Connector 10 generally comprises an elongated body 12 and an elongated backer frame 14. For purposes of description, body 12 will be described as comprising opposite ends 16 and 18, top 20 and bottom 22. Body 12 is provided with inner and outer walls 24 and 26 respectively which define a card slot 28 extending downwardly therebetween from the upper ends thereof.

Figure 3:
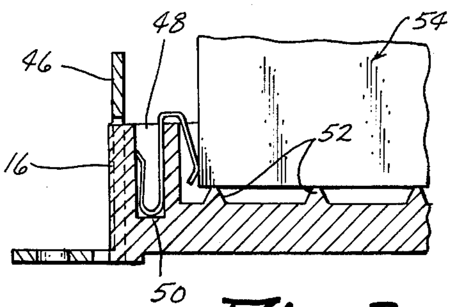
FIG. 3 is an enlarged sectional view seen on lines 3—3 of FIG. 1.
Figure 5:
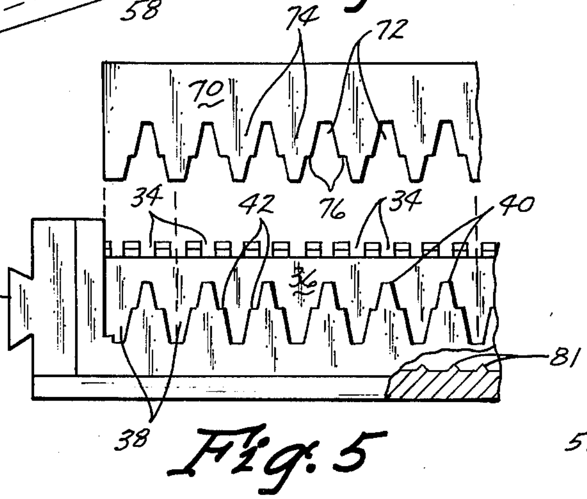
FIG. 5 is a partial plan view illustrating the manner in which the backer frame is secured to the body.

Inner wall 26 has an inner side 30 which is positioned adjacent the card slot and an outer side 32. The inner and outer sides of the inner wall 26 have a plurality of aligned and spaced-apart contact slots 34 formed therein. In other words, contact slots are provided in the outer side of inner wall 26 which extend over the top of wall 26 and which continue on in the inner side 30 of wall 26. The lower end of outer side 32 of wall 26 is defined by a shoulder 36 extending towards outer wall 24 seen in the drawings. A plurality of V-shaped slots 38 are formed in the lower end of body 12 as seen in FIG. 5. The V-shaped slots 38 communicate with alternate slot 34 as also seen in FIG. 5. The slots 38 are defined by projections 40. Each of the projections 40 is provided with shoulders 42 for a purpose to be described in more detail hereinafter. End 16 is provided with a dove-tail flange 44 which is adapted to be received by a metal clip 46 for mounting purposes. Slot 48 extends downwardly into the upper end of body 12 adjacent end 16 and is adapted to receive one end of a spring clip 50. As seen in FIG. 3, the lower end of card slot 28 is provided with a plurality of spaced-apart ribs 52 which are adapted to support the lower end of the edge board generally referred to by the reference numeral 54. The inner surface of outer wall 24 is provided with a plurality of spaced-apart ribs 56, the thickness of which control the width of the card slot 28.

Figure 6:
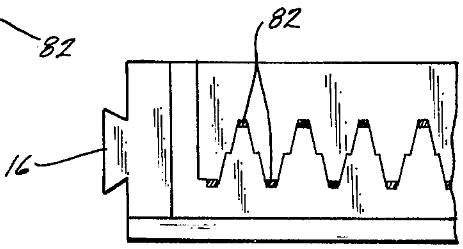
FIG. 6 is a sectional view seen on lines 6—6 of FIG. 4.
Figure 7:
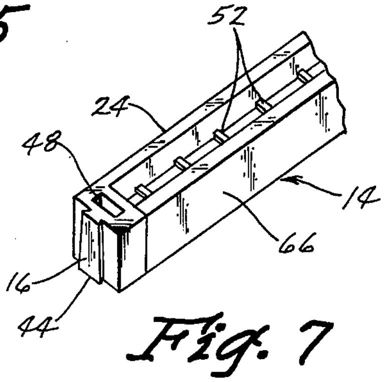
FIG. 7 is a partial perspective view of the connector.

Backer frame 14 includes opposite ends 58 and 60, and upper and lower ends 62 and 64. Backer frame 14 includes an outer wall surface 66 having an inwardly extending flange 68 at the upper end thereof. Backer frame 14 is also provided with an inwardly extendng flange 70 at its lower end which has a plurality of V-shaped slots 72 formed therein defining V-shaped projections 74 therebetween. The V-shaped projections 74 are provided with shoulders 76 which are adapted to interference fit with the shoulders 42 on the projections 40 of body 12 as illustrated in FIG. 6 for purposes of ultrasonic welding. Backer frame 14 is provided with a dove-tail flange 78 at end 60 and is provided with a slot 80 extending downwardly thereinto from the upper end thereof adjacent end 60. Backer frame 14 is provided with a plurality of energy directors or contacts 81 adapted to provide a means for welding or connecting backer frame 14 to body 12.

Figure 2:
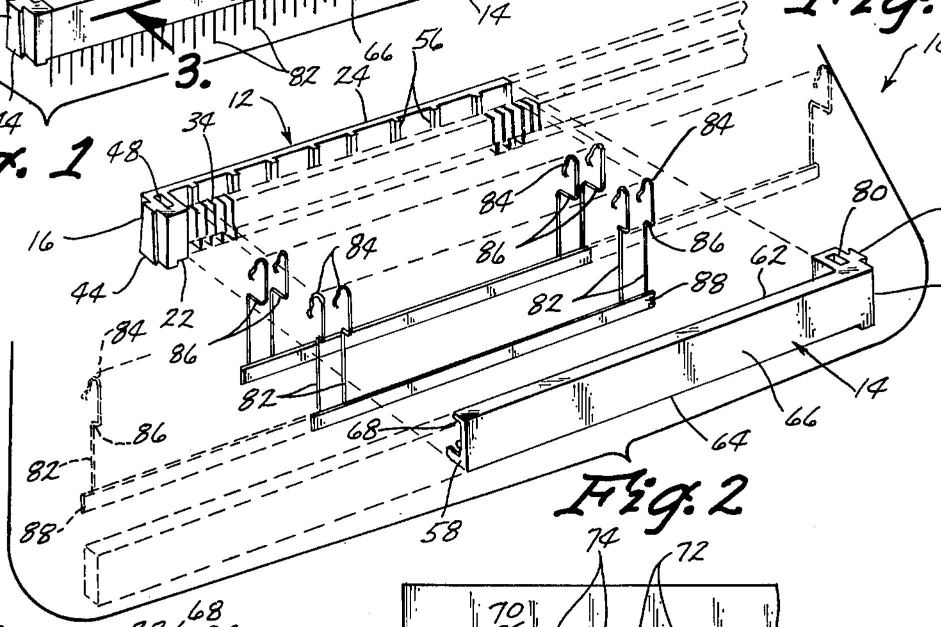
FIG. 2 is an exploded perspective view of the connector of FIG. 1.

The numeral 82 refers to contacts which are positioned between the body 12 and backer frame 14 and which generally include an arcuate upper end portion 84 and a shoulder of offset portion 86. FIG. 2 illustrates the contact springs 82 having their lower ends joined by a strip 88 but it should be noted that this is for fabrication and assembly purposes only since the strip 88 is severed from the contacts 82 after the connector has been assembled. The strip 88 and the contacts 82 thereon are commonly referred to as a contact frame. In FIG. 2, a pair of contact frames are illustrated but it should be understood that a single contact frame could be employed. It should also be understood that either or both contact frames may have selected contacts omitted to produce a varied selection of contact patterns and densities.

Figure 4:
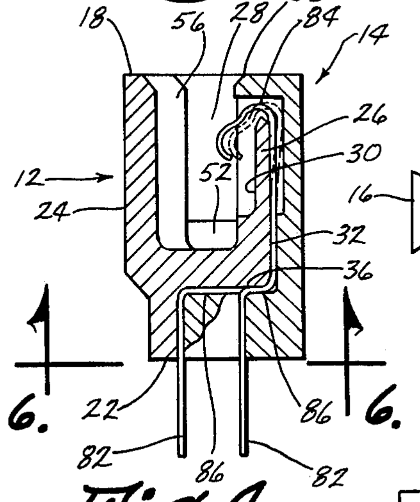
FIG. 4 is an enlarged sectional view seen on lines 4—4 of FIG. 1.

The connector 10 of FIGS. 1–7 is assembled as follows. The body 12 and the backer frame 14 have a closed end and an open end. That is, the closed end of body 12 is end 16 while the end 18 is considered as an open end while end 60 of backer frame 14 is the closed end with the end 58 being the open end. Ordinarily, the body 12 and backer frame 14 would be molded so as to have a length of slightly over 6 inches. Such a length permits the body 12 and backer frame 14 to be cut to the desired length to accomodate any substrate or card length ranging from 1.0 inches to 6.0 inches. In other words, after the substrate length has been determined, the open end of body 12 (end 18) and the open end of backer frame 14 (end 58) would be cut to the desired length. The slots 34 in body 12 are 0.050 inches apart which permits the contact density or spacing to be either 0.050 inches centers or 0.100 inches centers by simply omitting one of the contact frames. If a contact density of 0.050 inches is desired, the two contact frames would be mounted on the body 12 so that the contacts are received in each of the slots 34 with the arcuate portions 84 of the springs extending over the top of the upper end of the wall 26 as illustrated in FIG. 4. Frame 14 is then attached to body 12 in the mannner illustrated in FIGS. 5, 6 and 7 so that the contacts 82 are positioned between the registering projections 40, 74 and V-shaped notches 38 and 72 as illustrated in FIG. 6. The contacts 82 limit the inward movement of backer frame 14 relative to body 12. As stated, the shoulders 42 and 76 provide an interference fit for ultrasonic welding purposes. The positioning spring 50 is mounted in either of the openings 48 or 80 to provide index registration (that dimension from one edge (left or right) to the center line of the first connecting pad of the pads 90 on card 54—the manner in which the devices are manufactured) from either the right or left end. The positioning spring 48 urges the card 54 to either the right or left end of the device so that positive indexing is provided between the arcuate portions of the contacts and the connecting pads 90.

The connector 10 may accommodate cards or substrates of various width by simply varying the thickness of ribs 56. This can be easily done in the conventional molding operation without a special die or pattern for the member 12. The same backer frame 14 is utilized regardless of slot width. When the backer frame 14 has been positioned relative to the body 12, the backer frame 14 is secured to the body 12 by ultrasonic welding.

It can be seen in FIG. 4 that the vertical portion of contact 82 is permitted some lateral deflection relative to wall 26 due to the construction therof to permit the card 54 to be inserted into the connector in such a manner so as to require lower initial insertion forces, thus protecting the glass of edgeboard 54. The arcuate portion 84 is then deflected and compressed to provide maximum obtainable individual contact pressure for optimum contact resistance. This feature is best described as being a dual-deflection mode of contact.

Thus it can be seen that the connector 19 has many advantages over the heretofore available devices. The thermoplastic material is easily cut to length with the "cut-off" portions being able to be reground and reused or recycled. The body and backer frame are easily cut to the necessary length and are adaptable for various contact spacing and density thereby greatly reducing the required inventory and substantially reducing the requirement of "custom design" . Thus it can be seen that the connector 10 accomplishes at least all of the stated objectives.

Figure 8:
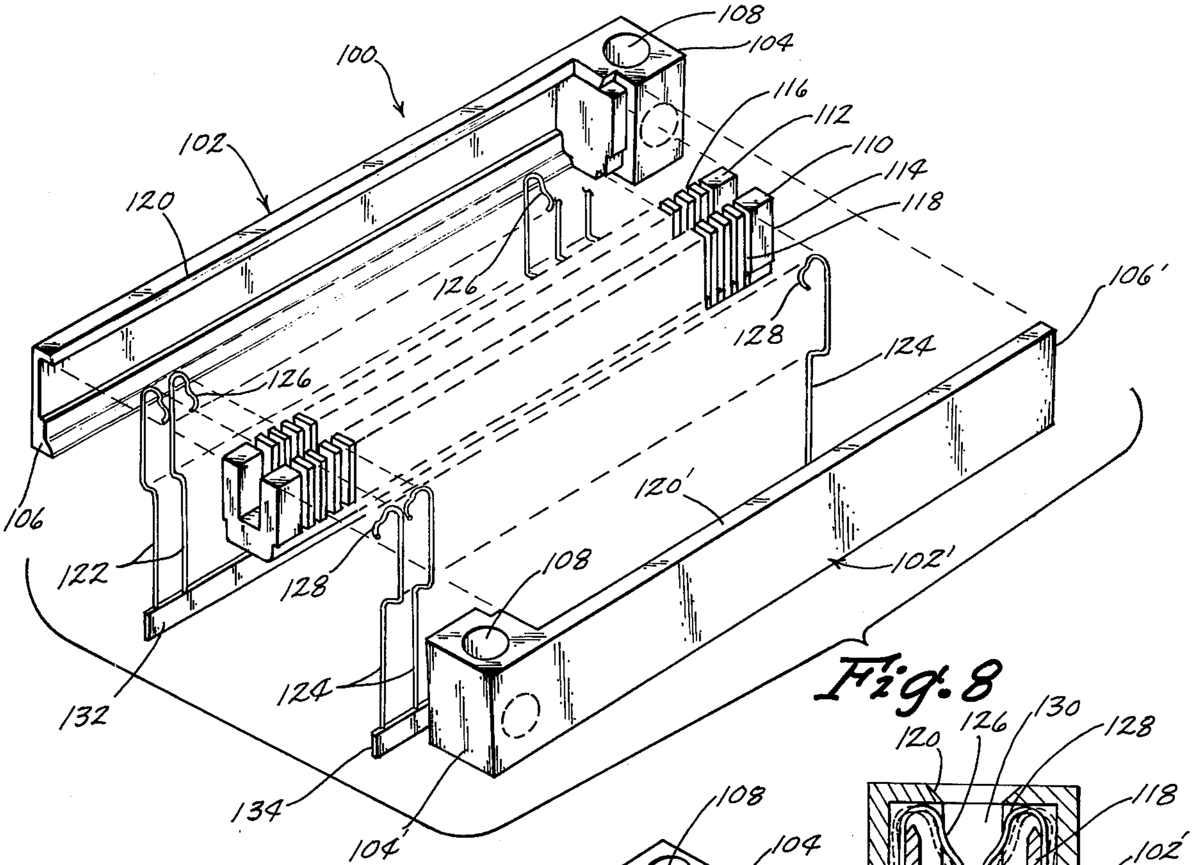
FIG. 8 is an exploded perspective view of a modified from the connector.
Figure 9:
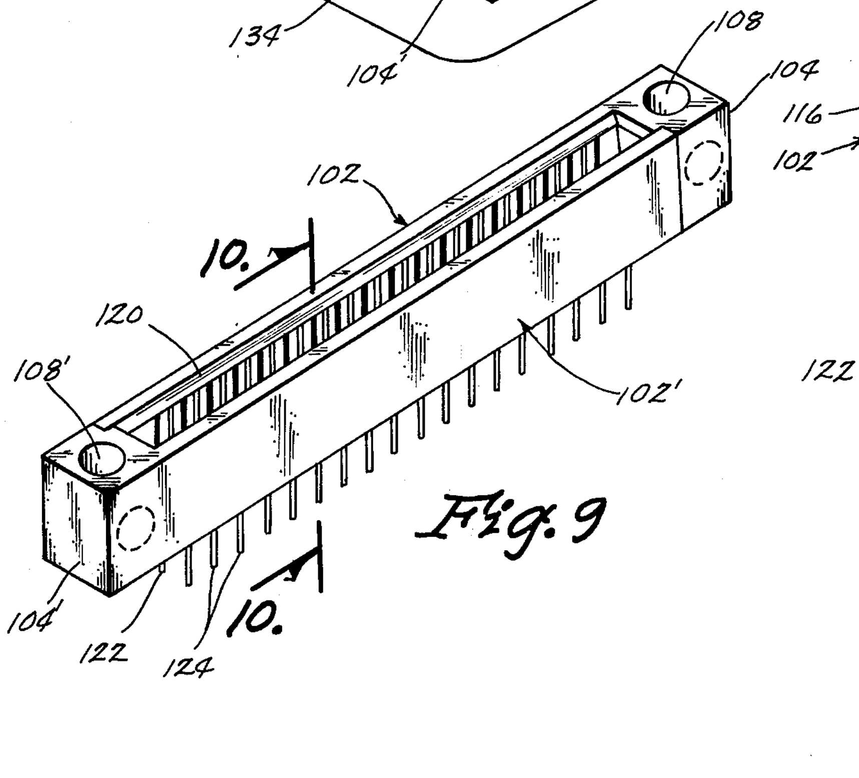
FIG. 9 is a perspective view of the assembled connector in FIG. 8.
Figure 10:
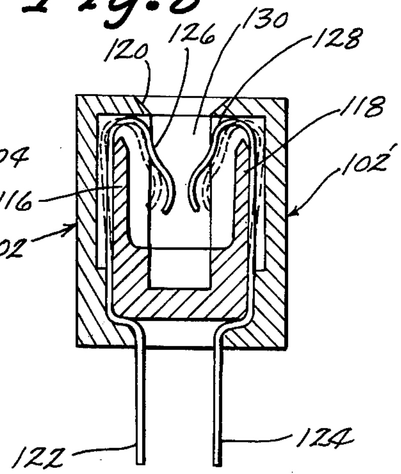
FIG. 10 is an enlarged sectional view seen on lines 10—10 of FIG. 9.

FIGS. 8 – 10 illustrate a modified form of the connector referred to generally by the reference numeral 100. Connector 10 is designed to accomodate those substrates or cards having connecting pads on both sides of the lower edge thereof. Connector 100 is comprised of identical frame members 102 and 102'. Frame 102 includes a closed end 104 and an open end 106 while frame member 102 is provided with a closed end 104' and an open end 106'. Frame members 102 and 102' are provided with mounting holes 108 and 108' formed therein to facilitate the attachment of the device to a suitable mounting surface. If desired, the mounting openings could extend at right angles to those illustrated and such mounting holes are illustrated by broken lines in FIGS. 8 and 9.

A U-shaped body insert 110 is positioned between the frame members 102 and 102' as illustrated in the drawings and has a pair of walls 112 and 114 having spaced-apart slots 116 and 118 formed therein as illustrated. Frame members 102 and 102' are provided with inwardly extending flanges 120 and 120'. Contacts 122 and 124 are received by the contact slots 116 and 118 respectively so that the arcuate portions 126 and 128 extend into the card slot area referred to generally by the reference numeral 30.

The open ends 106 and 106' of the connector 100 are cut to the desired length as in connector 10 and the connector is assembled and secured by ultrasonic welding. After welding, the strips 132 and 134 may be cut from the lower ends of the contacts 122 and 124. As seen in FIG. 10, the arcuate portions 126 and 128 may be deflected to the positions illustrated by broken lines to facilitate the insertion of the card or substrate therein which reduces the amount of insertion pressure normally required. Such deflection is permitted by the spacing of the walls 112 and 114 from the frame members 102 and 102' as seen in FIG. 10.

The contact spacing and density may be varied as required depending upon the particular card or substrate being accommodated.

The connection 100 accomplishes all of the results accomplished by connection 10 with the additional feature of being able to accomodate those substrates or cards having connecting pads on opposite sides of the lower ends therof. Thus it can be seen that the connector of this invention accomplishes at least all of the stated objectives.

I claim:

1. A connector for a substrate comprising, an elongated body having opposite ends, and upper and lower ends, said body having inner and outer walls defining a substrate slot extending downwardly therbetween from the upper end therof, contact positioning means on said inner wall, spaced-apart contacts mounted on said inner wall and having an upper end portion extending over said inner wall into said substrate slot, the lower ends of said contacts extending downwardly from said body, and an elongated backer frame having opposite ends, and upper and lower ends, said backer frame being secured to said body said body and said backer frame having V-shaped slots formed therein defining V-shaped projections therebetween, said contacts being received by said V-shaped slots, the V-shaped projections of said backer frame being received by the V-shaped slots in said body.

2. The connector of claim 1 wherein means is provided on said projections to provide an interference fit for ultrasonic welding purposes.

3. The connector of claim 2 wherein said means comprises abutting shoulder.

4. The connector of claim 1 wherein said inner wall of said body is spaced from said backer frame to permit deflection of said contacts upon insertion of a substrate into said substrate slot.

5. The connector of claim 1 wherein dove-tail mounting means is provided on said opposite ends of said body and backer frame, said dove-tail mounting means adapted to receive a mounting bracket thereon.

6. A connector for an edge board comprising, an elongated body having opposite ends, and upper and lower ends, said body having inner and outer walls defining a card slot extending downwardly therebetween from the upper end thereof, said inner wall having a first side adjacent said card slot and a second side opposite thereto, each of said first and second sides of said inner wall having a plurality of aligned and spaced apart contact slots formed therein, said lower end of said body having a plurality of V-shaped slots formed therein which extend upwardly therein and which are aligned with alternate contact slots, an elongated backer frame secured to said body and having opposite ends, and upper and lower ends, said backer frame having an inner wall surface positioned closely adjacent to second side of said body inner wall, said backer frame having its upper end extending over the upper end of said body inner wall, said lower end of said backer frame having a plurality of V-shaped slots formed therein which extend upwardly therein and which are aligned with alternate contact slots, and contacts in predetermined contact slots in said inner wall second side and having upper and lower ends, the upper ends of said contacts extending over the upper end of said body inner wall and extending downwardly into said card slot and being positioned in the contact slots in said inner wall first side, said lower ends of said contacts extending downwardly through said V-shaped slots outwardly of said body and backer frame.

7. A connector for a substrate comprising, a first frame member having opposite ends, and upper and lower ends, a second frame member secured to said first frame member and having opposite ends, and upper and lower ends, a U-shaped member positioned between said first and second frame members defining a substrate slot, said U-shaped member having spaced apart walls on opposite sides of said substrate slot, said U-shaped member having contact slots formed in the outer surface of each of its walls for receiving a contact therein, contacts positioned in predetermined contact slots and having upper end portions positioned on opposite sides of said substrate slot for electrically engaging connecting pads on opposite sides of a substrate, said contacts having lower end portions extending downwardly from said first and second frame members and said U-shaped member.

8. The method of fabricating a connector for a substrate comprising the steps of:

providing first and second connector members having a "closed" end and an "open" end, cutting the "open" end of both of said connector members to the desired length, positioning contacts between said first and second connector members, and securing said first connector member to said second connector member so that the "open" end of said first connector member engages the "closed" end of said second connector member and so that the "open" end of said second connector member engages the "closed" end of said first connector member.

9. A connector for a substrate, comprising, a first elongated frame member having first and second ends, a second elongated frame member having first and second ends, each of said frame members having a plurality of intermittently and closely arranged slots and projections which engage respective projections and slots in the other of said frame members to determine the longitudinal position of said frame members with respect to each other, the first ends of said frame members extending laterally towards the other of said frame members and abutting the second end of the other of said frame members, whereby the second ends of said frame members can be selectively trimmed to create first and second frame members of equal length, and whereby connectors of predetermined length can be created from a pair of such trimmed first and second frame members, an elongated slot opening in said connector for receiving an edgeboard, and electrical contacts in said elongated slot for effecting electrical connection to an edgeboard, said contacts extending exteriorally from said connector.

10. The connector of claim 9 wherein said contacts exit said connector through said slots and projections of said first and second members.

11. The connector of claim 9 wherein said contacts have an elongated portion and arcuate portion, and said contacts are in communication with said elongated slots, whereby initial penetration of an edgeboard into said slot will deflect the elongated portion of said contacts, and complete penetration of said edgeboard in said elongated slot will deflect the arcuate portion of said contacts.

12. A connector for a substrate comprising, an elongated body having opposite ends, and upper and lower ends, said body having inner and outer walls defining a substrate slot extending downwardly therebetween from the upper end thereof, contact positioning means on said inner wall, spaced-apart contacts mounted on said inner wall and having an upper end portion extending over said inner wall into said substrate slot, the lower ends of said contacts extending downwardly from said body, and an elongated backer frame having opposite ends, and upper and lower ends, said backer frame being secured to said body, and substrate indexing means extending downwardly into said substrate slot for urging the substrate lengthwise in said slot.

13. A connector for a substrate comprisiing, an elongated body having opposite ends, and upper and lower ends, said body having inner and outer walls defining a substrate slot extending downwardly therebetween from the upper end thereof, contact positioning means on said inner wall, spaced-apart contacts mounted on said inner wall and having an upper end portion extending over said inner wall into said substrate slot, the lower ends of said contacts extending downwardly from said body, and an elongated backer frame having opposite ends, and upper and lower ends, said backer frame being secured to said body, one end of said body having a shoulder means extending transversely therefrom, said body shoulder means presenting an upstanding wall surface which is transverse to the longitudinal axis of said body, the other end of said body being substantially straight, one end of said backer frame being substantially straight, the other end of said backer frame having a shoulder means extending transversely therefrom, said backer frame shoulder means presenting an upstanding wall surface which is transverse to the longitudinal axis of said backer frame, said other end of said backer frame engaging and abutting said wall surface of said shoulder means at said body one end, said other end of said body engaging and abutting said wall surface of said bracket frame shoulder means.

* * * * *